(12) United States Patent
Rodriguez et al.

(10) Patent No.: US 10,319,806 B2
(45) Date of Patent: Jun. 11, 2019

(54) ELECTRODE FOR A METAL-INSULATOR-METAL STRUCTURE, CAPACITOR OF METAL-INSULATOR-METAL TYPE, AND METHOD FOR FABRICATING ONE SUCH ELECTRODE AND ONE SUCH CAPACITOR

(71) Applicants: COMMISSARIAT À L'ENERGIE ATOMIQUE ET AUX ENERGIES ALTERNATIVES, Paris (FR); STMICROELECTRONICS (CROLLES 2) SAS, Crolles (FR)

(72) Inventors: Guillaume Rodriguez, Le Champ Près Froges (FR); Aomar Halimaoui, La Terrasse (FR); Laurent Ortiz, Le Pont-de-Claix (FR)

(73) Assignees: COMMISSARIAT À L'ENERGIE ATOMIQUE ET AUX ENERGIES ALTERNATIVES, Paris (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 15/220,869

(22) Filed: Jul. 27, 2016

(65) Prior Publication Data
US 2017/0033174 A1 Feb. 2, 2017

(30) Foreign Application Priority Data
Jul. 28, 2015 (FR) .................................. 15 57206

(51) Int. Cl.
*H01L 27/108* (2006.01)
*H01L 49/02* (2006.01)

(52) U.S. Cl.
CPC .............. *H01L 28/75* (2013.01); *H01L 28/56* (2013.01); *H01L 28/57* (2013.01); *H01L 28/65* (2013.01); *H01L 27/10805* (2013.01)

(58) Field of Classification Search
CPC ....... H01L 29/7869; H01L 2224/32245; H01L 29/517; H01L 28/55; H01L 28/56;
(Continued)

(56) References Cited

U.S. PATENT DOCUMENTS 6,479,849 B1 * 11/2002 Katori .................... H01L 28/55
257/296
6,887,716 B2 * 5/2005 Fox .................. H01L 21/02197
257/E21.01
(Continued)

FOREIGN PATENT DOCUMENTS

JP 2011-035246 A 2/2011

OTHER PUBLICATIONS

Liao et al., Novel Integration of Metal-Insulator-Metal (MIM) Capacitors Comprising Perovskite-type Dielectric and Cu Bottom Electrode on Low-Temperature Packaging Substrates, Jan. 2008, IEEE Electron Device Letters, vol. 29, No. 1, pp. 31-33.*
(Continued)

*Primary Examiner* — Nathan W Ha
(74) *Attorney, Agent, or Firm* — Oliff PLC

(57) ABSTRACT

The electrode for a structure of Metal-Insulator-Metal type is formed by a stack successively comprising a gold layer, a barrier layer made from electrically conducting oxide and a platinum layer.
The electrically conducting oxide is advantageously a noble metal oxide, and preferentially ruthenium oxide.
The electrode is arranged on a substrate. The gold layer of the electrode is separated from the substrate by an adhesion layer made from titanium dioxide.

(Continued)

The electrode is used to fabricate a capacitor of Metal-Insulator-Metal type.

19 Claims, 5 Drawing Sheets

(58) Field of Classification Search
CPC ......... H01L 28/60; H01L 28/65; H01L 28/75; H01L 28/57
See application file for complete search history.

(56) References Cited

U.S. PATENT DOCUMENTS

| | | | |
|---|---|---|---|
| 2002/0006674 A1* | 1/2002 | Ma | H01L 21/31122 438/3 |
| 2009/0021109 A1* | 1/2009 | Furukawa | H01L 24/11 310/313 R |
| 2010/0187584 A1 | 7/2010 | Matsuda | |
| 2010/0301436 A1* | 12/2010 | Sashida | H01L 21/28556 257/421 |
| 2011/0250402 A1* | 10/2011 | Oldham | G01N 21/648 428/172 |
| 2014/0312361 A1* | 10/2014 | Ohtsu | H01L 24/83 257/77 |
| 2015/0221658 A1* | 8/2015 | Wang | H01L 21/324 257/532 |
| 2015/0228885 A1* | 8/2015 | Abbott, Jr. | H01L 41/0815 347/71 |
| 2015/0349251 A1* | 12/2015 | Chang | H01L 45/1233 257/3 |
| 2016/0254386 A1* | 9/2016 | Yamazaki | H01L 29/7869 257/43 |
| 2016/0343809 A1* | 11/2016 | Green | H01L 29/2003 |

OTHER PUBLICATIONS

C.H. Johansson et al. "Rontgenographische Und Elektrische Untersuchungen Des CuAu-Sytems". Annalen der Physik, Jan. 1936, vol. 25, pp. 1-48.

* cited by examiner

ELECTRODE FOR A METAL-INSULATOR-METAL STRUCTURE, CAPACITOR OF METAL-INSULATOR-METAL TYPE, AND METHOD FOR FABRICATING ONE SUCH ELECTRODE AND ONE SUCH CAPACITOR

FIELD OF THE INVENTION

The field of invention is that of metallic multilayers usable in microelectronics for making interconnects, and more particularly for fabricating electrodes for a structure of Metal-Insulator-Metal type, requiring thermal annealing at high temperature without impairing the conductivity of the electrode.

STATE OF THE ART

A structure of Metal-Insulator-Metal (MIM) type can be used either for producing memories, such as a Dynamic Random Access Memory (DRAM) or a Non Volatile Memory (NVM), or for fabricating MicroElectroMechanical Systems (MEMS), or for producing varactors usable in RF circuits for example.

The MIM structures comprise a layer of insulating material.

For the memories, if the insulating material is a dielectric material, operation is based on storage of electric charges, and if the insulating material is a ferroelectric material, operation makes use of the variation of the bias according to the electric field.

In the case of MEMS, a piezoelectric material is used.

For producing varactors, an insulator (ferroelectric or not) is used the capacitance of which varies considerably with the electric field applied to the terminals of the MIM capacitor.

Materials of perovskite type are perfectly suitable as insulating material for this type of structures. These materials do in fact present remarkable physical properties (ferroelectricity, piezoelectricity, pyroelectricity, etc) with high dielectric constant values.

As represented in FIG. 1, capacitors 1 of MIM type are flat capacitors, conventionally formed by a layer of material of perovskite type 2 located between an electrode called bottom electrode 3 in contact with a substrate 4, and an electrode called top electrode 5.

In order to obtain the best properties of the perovskite type material, the latter has to be well crystallized. A crystallization anneal at high temperature (at a temperature of more than 600° C.) and in an oxidising atmosphere is therefore generally performed after formation of the perovskite type material on the bottom electrode.

The physical properties of the bottom electrode must not be impaired when the anneal is performed. The bottom electrode is therefore conventionally made from platinum.

As represented in FIG. 1, several MIM capacitors 1, 1a are generally deposited on a substrate 4, for example made from oxidised silicon, and are connected to one another by a common bottom electrode 3. They can also be connected to other components by means of this bottom electrode which acts as contact.

However, for future technologies, the platinum bottom electrode represents a parasite line resistance which may be detrimental to the performances of the final product. It is therefore essential to reduce the line resistance significantly to facilitate its incorporation in a larger number of applications.

OBJECT OF THE INVENTION

The object of the invention is to at least partially remedy the shortcomings of the prior art, and in particular to propose an electrode presenting a low resistivity.

This object is achieved by an electrode comprising a layer of gold and a layer of platinum separated by a barrier layer made from electrically conducting oxide.

The electrically conducting oxide is advantageously a noble metal oxide, and preferentially ruthenium oxide.

Advantageously, the electrode is arranged on a substrate. The gold layer of the electrode is separated from the substrate by an adhesion layer made from titanium dioxide.

The adhesion layer is advantageously made from titanium dioxide or a $TiO_2$/metal bilayer, the metal being chosen from titanium, chromium, or tantalum.

Advantageously, the platinum layer has a thickness of about 100 nm and the gold layer has a thickness ranging from 1 μm to 2 μm.

Advantageously, the barrier layer is made from ruthenium oxide and has a thickness greater than or equal to 15 nm, preferably greater than or equal to 40 nm, and even more preferably greater than or equal to 80 nm.

This object is also achieved by a capacitor comprising:
one such electrode, forming a first electrode,
a second electrode,
a layer of dielectric material of perovskite type, arranged between the first electrode and second electrode.

The gold layer of the first electrode is advantageously separated from a substrate by an adhesion layer made from titanium dioxide.

This object is also achieved by a method for fabricating one such electrode comprising the following successive steps:
providing a substrate covered by an adhesion layer made from titanium dioxide,
forming an electrode on the adhesion layer, the electrode being formed by successive deposition of a gold layer, a barrier layer made from electrically conducting oxide and a platinum layer, the electrically conducting oxide advantageously being a noble metal oxide, and preferentially ruthenium oxide.

Advantageously, the platinum layer has a thickness of about 100 nm and the gold layer has a thickness ranging from 1 μm to 2 μm.

Advantageously, the barrier layer is advantageously made from ruthenium oxide and has a thickness greater than or equal to 15 nm, preferably greater than or equal to 40 nm, and even more preferably greater than or equal to 80 nm.

Advantageously, the adhesion layer is made from titanium dioxide or a $TiO_2$/metal bilayer, the metal being chosen from titanium, chromium, or tantalum.

This object is also achieved by a method for fabricating a capacitor comprising the following successive steps:
forming one such electrode on a substrate covered by an adhesion layer made from titanium dioxide, the gold layer of the first electrode being separated from the substrate by an adhesion layer made from titanium dioxide,
forming a layer of dielectric material of perovskite type on the electrode,
performing heat treatment at a temperature of at least 600° C. under oxygen so as to crystallize the dielectric material,
forming a second electrode on the crystallized dielectric material layer.

Advantageously, the temperature of the heat treatment is advantageously higher than or equal to 700° C., preferably higher than or equal to 850° C.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
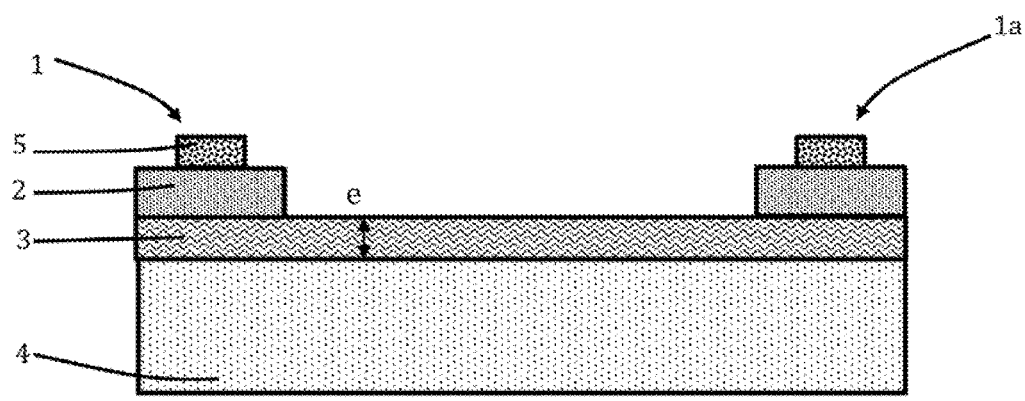
FIG. 1 represents two MIM capacitors connected via their bottom electrode, according to the prior art, in schematic manner, in cross-section.
Figure 2:
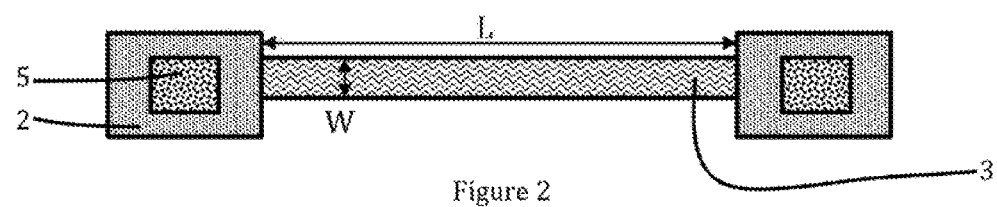
FIG. 2 represents two MIM capacitors connected via their bottom electrode, in schematic manner, in top view.

The line resistance of an electrode is defined by the relation R=ρL/We,
with ρ the resistivity of the metal,
and, as represented in FIGS. 1 and 2:
L is the length of the line
W is the width of the line
e is the thickness of the line.

The parameters L and W of the patterns of the lines of the device are fixed for a given technology by the design rules.

In conventional manner, the electrically conducting line which connects a capacitor to another component is formed by the bottom electrode of the capacitor, i.e. by a platinum line.

To reduce the line resistance, different options are available. It is possible to form a conducting line from a metal having a lower resistivity than that of platinum and/or to increase the thickness e of the line and therefore of the electrode.

To facilitate integration of this capacitor technology in more varied applications, it is preferable to reduce the line resistance by a factor 50.

A simple manner for correcting this problem is to deposit a film which is much thicker, about 50 times thicker. The conventional deposited thickness of platinum being 0.1 μm, to achieve the required performances, it will be necessary to deposit a platinum film having a thickness substantially equal to 5 μm. Such a large thickness of platinum is not conceivable for an industrial use. It will in fact give rise to mechanical problems (deformation of the substrate, risk of lift-off of the platinum, etc) and to problems of cost and integration.

It therefore appears advisable to replace the material forming the bottom electrode. Platinum presents a resistivity of 11 μΩ.cm. Among the metals presenting a lower resistivity than that of platinum, the best candidates are copper (resistivity of 1.75 μΩ.cm) and gold (resistivity of 2.25 μΩ.cm).

It is not possible to deposit a dielectric material of perovskite type having the electric performances sought for on copper and/or gold. It is therefore particularly advantageous to associate platinum with one of these two metals to obtain a reduction of the global resistivity of the line, compared with a line made solely from platinum, and to obtain good performances of the perovskite type dielectric material.

Figure 3:
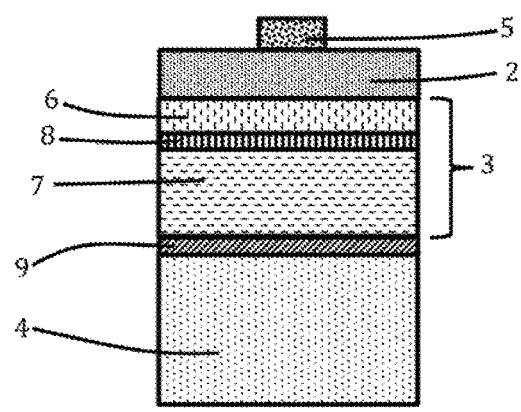
FIG. 3 represents a MIM capacitor according to an embodiment of the invention, in schematic manner, in cross-section.

As represented in FIG. 3, the bottom electrode 3 is formed by a stack comprising a gold layer 7 and a platinum layer 6.

The platinum layer has a thickness comprised between 80 nm and 120 nm.

Advantageously, the platinum layer 6 has a thickness of about 100 nm and the thickness of the gold layer 7 will be adjusted by the person skilled in the art to obtain the required line resistivity. The gold layer advantageously presents a thickness comprised between 500 nm and 2 μm.

Such a thickness of platinum results in a good crystallization of the perovskite type dielectric material when annealing is performed and, at the same time, this thickness remains sufficiently small (much less than 5 μm) to avoid mechanical stresses (lift-off of the layer, etc) and not to increase production costs.

For example, to reduce the resistivity of an electrode having a platinum layer 6 presenting a thickness of about 100 nm by a factor 50, a gold layer 7 with a thickness of about 1 μm is added.

To reduce the resistivity of the same electrode by a factor 100, the gold layer 7 will present a thickness of 2 μm.

The thickness of the gold layer 7 is advantageously less than 5 μm to prevent lift-offs, and the gold layer 7 preferably has a thickness ranging from 1 μm to 2 μm.

The following table gives the resistances R of different electrodes before and after annealing at 700° C. under dioxygen to recrystallize the perovskite type dielectric material.

| Stack | R before annealing (Ω) | R after annealing (Ω) |
| --- | --- | --- |
| Pt(100 nm) | 1.5 | 1.42 |
| Cu(1 μm)/Pt(100 nm) | 0.019 | insulating |
| Au(1 μm)/Pt(100 nm) | 0.028 | 0.144 |

Before annealing, the line resistances of the Pt/metal electrodes are lower by at least a factor 50 than those of the line resistance of a platinum electrode.

The inventors observed that, when annealing is performed in the presence of dioxygen, the couple oxidises and becomes insulating and the gold diffuses into the platinum forming a gold-platinum alloy.

The line resistivities increase, after annealing. For a line made from gold and platinum, the gain in resistivity is then only by a factor 10 compared with the resistivity of a platinum line.

When a stack formed by at least two metallic layers is subjected to heat treatment, an interdiffusion of the two metallic layers does in fact take place leading to a large increase of the resistivity (C. H. Johansson and J. O. Linde, "Rontgenographische und elektrische Untersuchungen des CuAu-Systems"; Annalen der Physik, 1936, 25, 1-48).

This resistivity increase leads to an increase of the parasite resistance when this multilayer stack is used to make an interconnection, or more particularly for fabricating an electrode of a MIM device.

The applicant discovered that the presence of a barrier layer made from electrically conducting oxide 8 not only prevented interdiffusion of the platinum and gold, but also enabled a lower line resistance to be obtained after annealing. What is meant by barrier layer is a thin layer able to prevent interdiffusion of two metals, in particular here this involves diffusion of gold into platinum.

The oxide is advantageously a noble metal oxide. It is chosen from ruthenium oxide or any oxide of a noble metal such as platinum oxide, or preferentially iridium oxide.

A layer of ruthenium oxide is advantageously easy to fabricate and can withstand a high-temperature treatment in an oxidising atmosphere.

The electrode according to the invention, for a structure of Metal-Insulator-Metal type, is formed by a stack successively comprising a gold layer 7, a ruthenium oxide barrier layer 8 and a platinum layer 6 (FIG. 3).

The line resistance of such an electrode 3 was measured before and after annealing. For comparative purposes, the line resistance of an electrode comprising a barrier layer made from WN was also measured. This material is commonly used in microelectronics.

The following table gives the resistances R of the different electrodes before and after annealing at 700° C. under dioxygen.

| Stack | R before annealing (Ω) | R after annealing (Ω) |
|---|---|---|
| Pt(100 nm) | 1.5 | 1.42 |
| Au(1 μm)/Pt(100 nm) | 0.028 | 0.144 |
| Au(1 μm)/WN(10 nm)/Pt(100 nm) | 0.036 | 0.068 |
| Au(1 μm)/RuO$_2$(60 nm)/Pt(100 nm) | 0.031 | 0.0241 |

With an intermediate layer made from WN, the resistance of the electrode increases after annealing.

Figure 4:
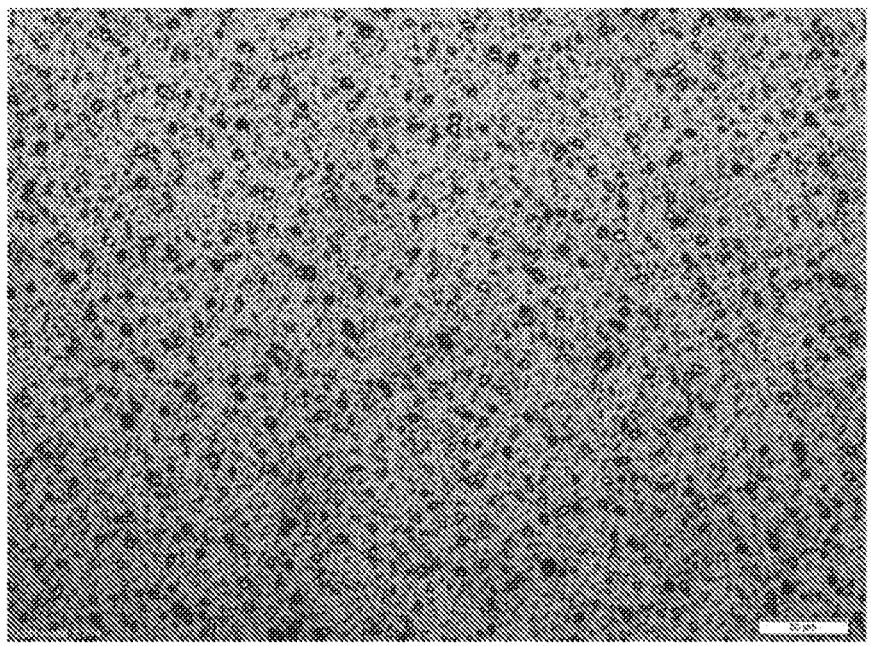
FIG. 4 represents the surface of an Au/WN/Pt electrode, after annealing, observed with an optic microscope.

Furthermore, after annealing, as illustrated in FIG. 4, the platinum layer of the electrode present defects (holes, bumps). These defects seem to originate from oxidisation of WN, when the anneal is performed, which leads to the formation of WO$_3$ and N$_2$ and to a gas release through the platinum layer.

Figure 5:
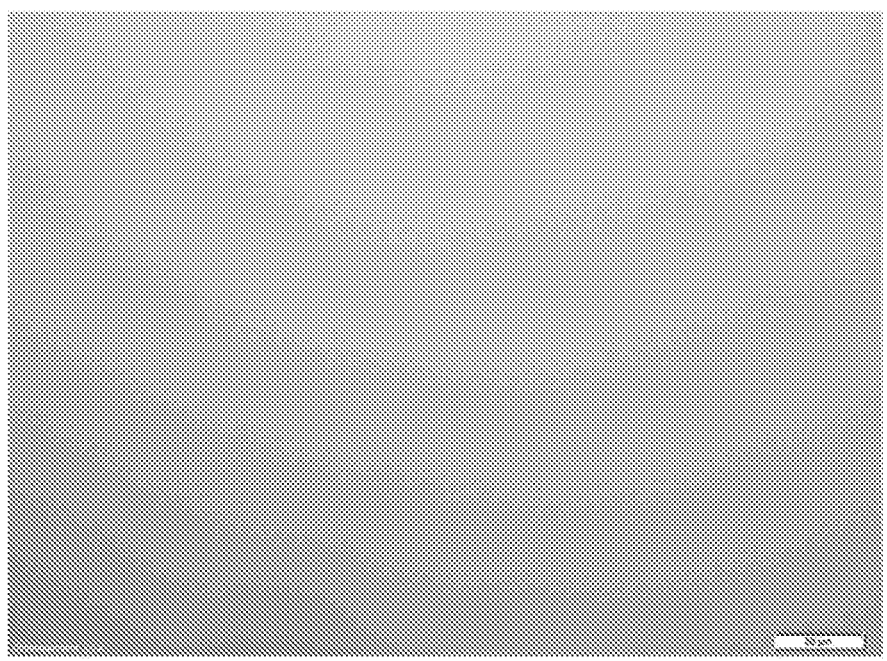
FIG. 5 represents the surface of an Au/RuO$_2$/Pt electrode, after annealing, observed with an optic microscope.

The Au/RuO$_2$/Pt stack is thermally and chemically stable. Even with thermal annealing, there is no delamination or diffusion between the gold and platinum. As illustrated in FIG. 5, the layers obtained are of very good quality. There are no surface defects.

Ruthenium oxide forms an excellent diffusion barrier. A ruthenium oxide barrier layer can be used as barrier layer even at high temperature (at least 700° C.) and in an oxidising atmosphere.

The line resistance of the Au/RuO$_2$/Pt electrode, after annealing, is 50 times lower than that of a platinum electrode.

The line resistance of such an electrode decreases after annealing. This decrease can be due to a better quality of the layers, and to their recrystallization during the heat treatment.

Figure 6:
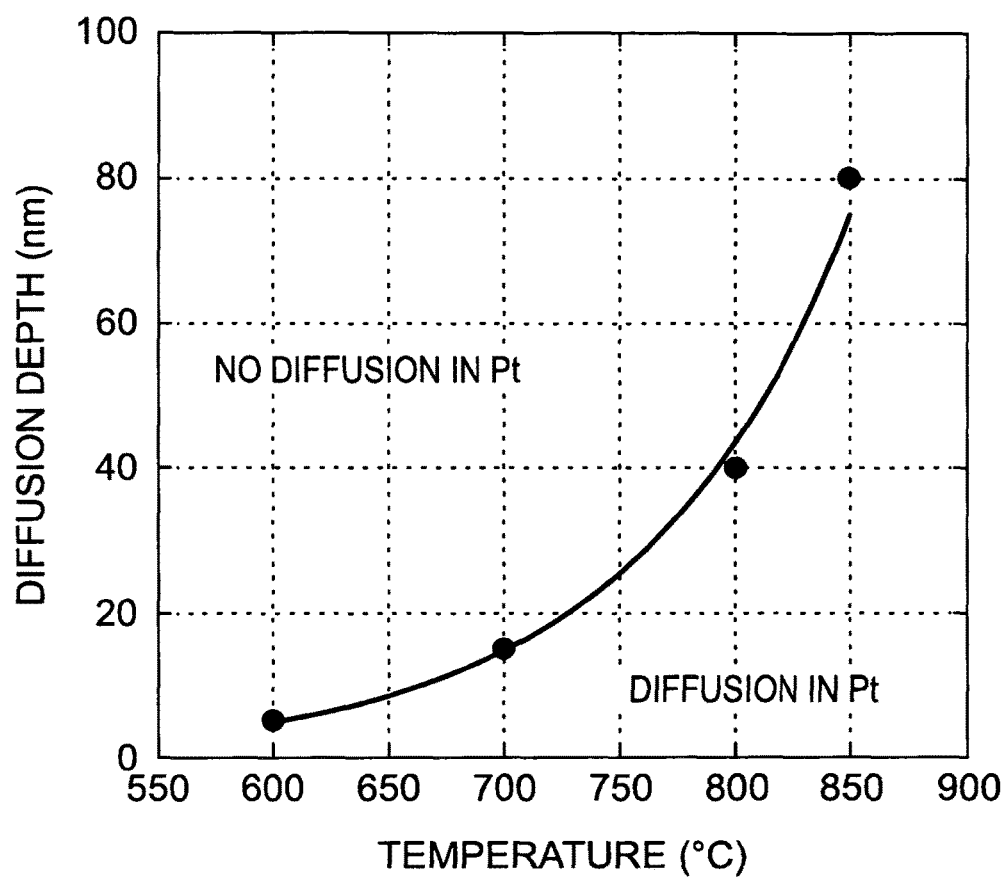
FIG. 6 represents the diffusion depth of gold into platinum versus the temperature.

The ruthenium oxide thin layer 8 has a thickness greater than or equal to 15 nm. As represented in FIG. 6, a ruthenium oxide layer 8 with such a thickness forms of sufficient diffusion barrier for anneals at 700° C. The gold does not diffuse into the platinum.

Preferentially, the ruthenium oxide thin layer 8 has a thickness greater than or equal to 40 nm, and, even more preferentially, greater than or equal to 80 nm.

These thicknesses enables recrystallization anneals to be performed up to 800° C.

The larger the thickness of the barrier layer, the more efficient the barrier layer is at higher temperature.

For example, for a thickness of 80 nm, it is possible to perform anneals up to 850° C. of 60 seconds without the gold diffusing into the platinum.

The annealing times are comprised between 15 seconds and 10 minutes, and preferably between 30 seconds and 5 minutes.

The electrode 3 is arranged on a substrate 4 (FIG. 3). The gold layer 7 of the electrode 3 is separated from the substrate 4 by an adhesion layer 9 made from titanium dioxide. This adhesion layer 9 enhances the adhesion of the gold layer 7 on the substrate.

What is meant by titanium dioxide adhesion layer is that the adhesion layer is made from titanium oxide or that the adhesion layer is a TiO$_2$/Metal bilayer, the TiO$_2$ being in contact with the first electrode. The metal is chosen from metals having a good adhesion on silicon oxide in particular. The metal can be chosen from titanium, chromium, or tantalum. It is preferably formed by a TiO$_2$/Ti bilayer.

The adhesion layer between a gold layer and a substrate is generally made from titanium. However, the applicant observed, in unexpected manner, that a titanium adhesion layer 9 led to diffusion of the gold to the platinum layer in spite of the presence of the RuO$_2$ barrier layer 8.

Figure 7:
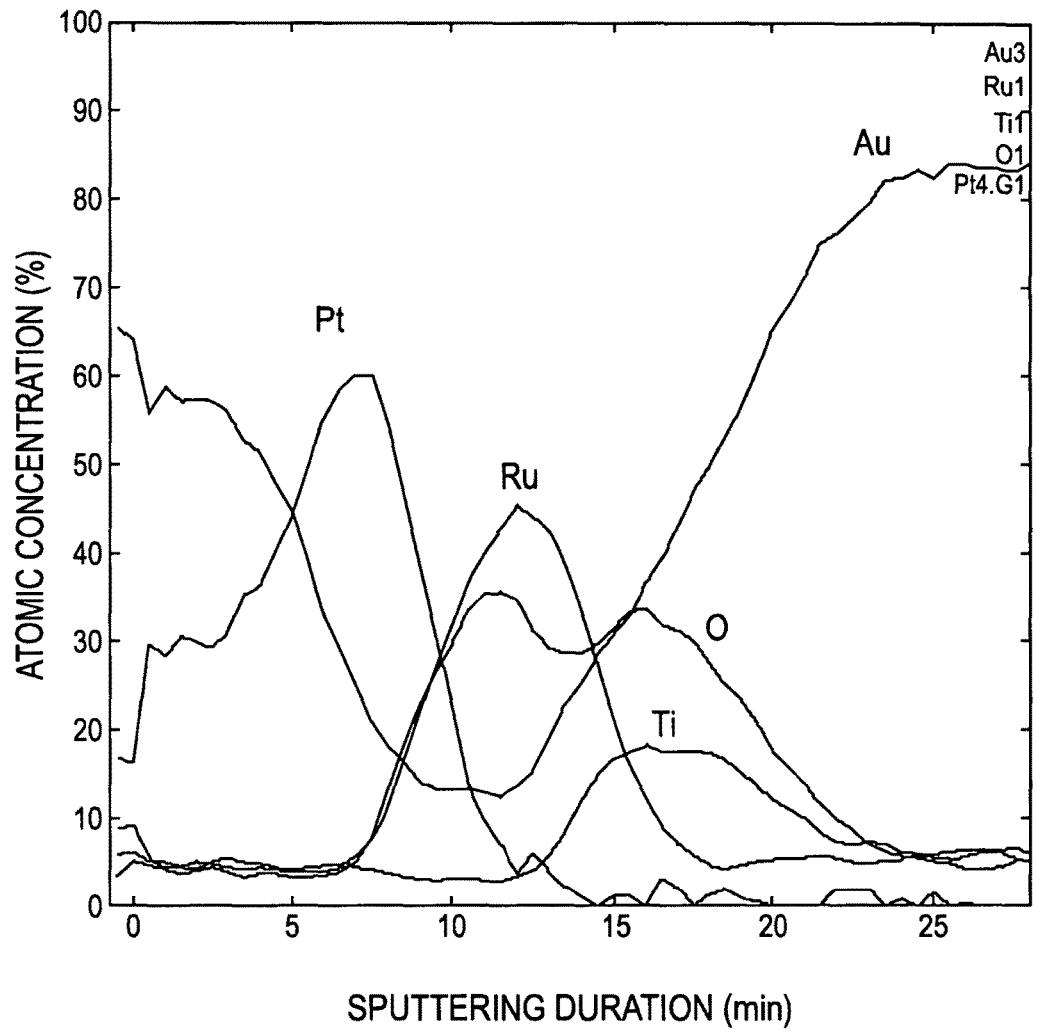
FIG. 7 represents an Auger profile of a Ti/Au/RuO$_2$/Pt stack, after annealing.

The curve plot of FIG. 7 represents an Auger profile through the electrode from the platinum layer 6 to the titanium adhesion layer 9, after annealing. The titanium diffuses up to the RuO$_2$ barrier layer 8, with which it reacts to form ruthenium and titanium dioxide, which impairs the properties of the barrier layer 8 and leads to diffusion of the gold into the platinum.

Figure 8:
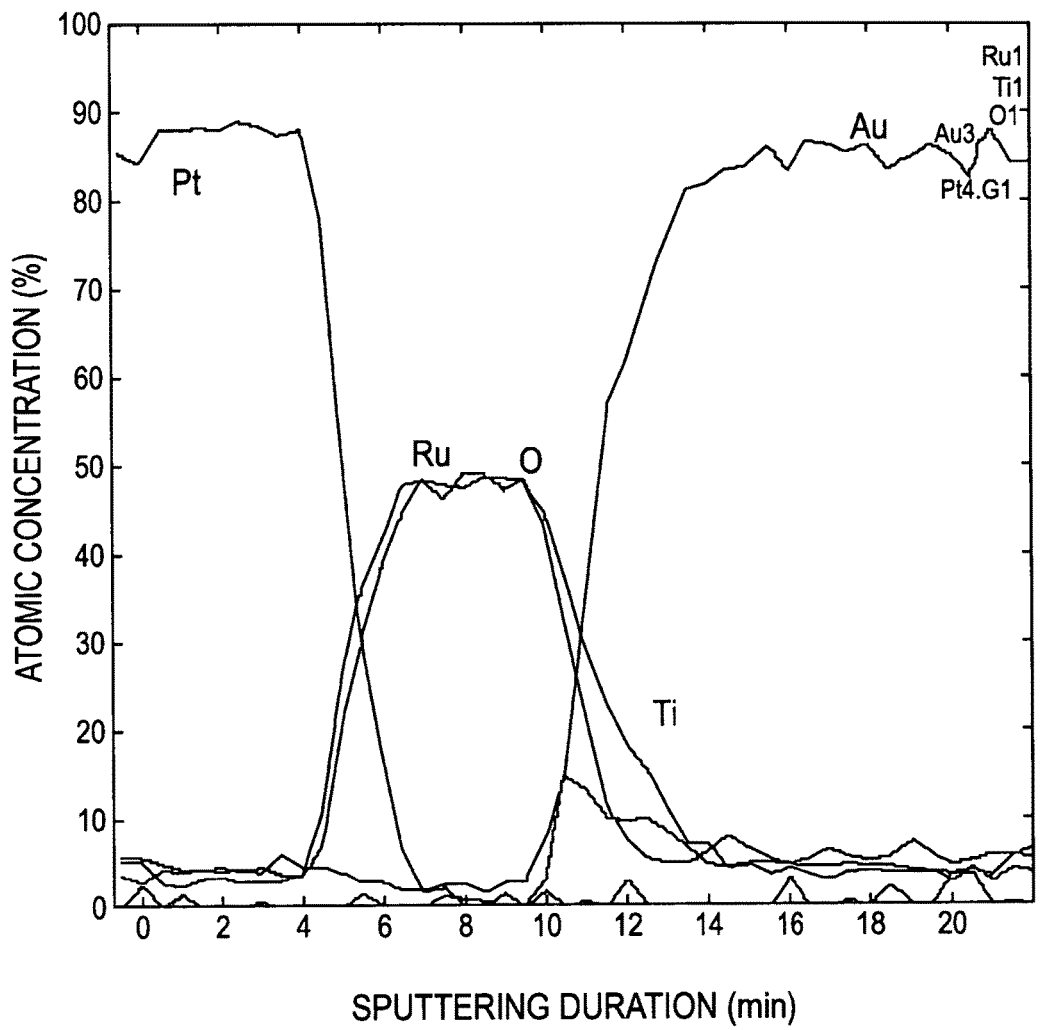
FIG. 8 represents an Auger profile of a TiO$_2$/Au/RuO$_2$/Pt stack, after annealing.

On the other hand, when the adhesion layer 9 comprises a titanium dioxide layer in contact with the first electrode 3, even after annealing, the ruthenium dioxide barrier layer 8 is intact (FIG. 8). The gold does not diffuse into the platinum layer 6. The line resistance of the electrode 3 is low.

The first electrode 3 is located on a substrate 4.

According to one embodiment, the substrate is intrinsically electrically insulating. The substrate is for example made from glass.

For lower annealing temperatures, the substrate could also be made from polymer.

In another embodiment, the substrate 4 is electrically conducting or semi-conducting. The surface of the substrate 4 is advantageously covered by a layer of electrically insulating material, called insulating layer, in order to insulate the MIM 1 structure from said substrate 4.

The electrically insulating material is advantageously formed by an electrically insulating oxide, such as for example silicon oxide. According to another alternative, it can be formed by a silicon nitride or a tantalum oxide.

The insulating layer has a thickness of a few nanometres, or a few tens of nanometres.

The substrate is for example made from silicon or from germanium, and is covered by a layer of electrically insulating oxide. The substrate 4 is advantageously made from oxidised silicon.

An adhesion layer 9 made from titanium dioxide is advantageously arranged between the first electrode 3 and the substrate 4, or between the first electrode 3 and the electrically insulating layer if the substrate 4 is electrically conducting.

The method for fabricating an electrode 3 as described in the foregoing comprises the following successive steps:

a) providing a substrate 4 covered by an adhesion layer 9 made from titanium dioxide,
b) forming an electrode 3 on the adhesion layer 9, the electrode 3 being formed by successive deposition of a gold layer 7, a ruthenium oxide barrier layer 8 and a platinum layer 6.

The electrode 3 can be used to form the first electrode of a MIM structure.

Preferentially, the electrode 3 is used to form a capacitor 1, of Metal-Insulator-Metal type, comprising (FIG. 3):
a first electrode 3, as previously described,
a second electrode 5,
a layer of perovskite type dielectric material 2, located between the first electrode 3 and second electrode 5.

The dielectric material of the capacitor presents a high dielectric constant. What is meant by high is at least 500. The perovskite type dielectric material is electrically insulating.

The perovskite type dielectric material is an oxide advantageously chosen from $Pb[Zr_xTi_{1-x}]O_3$ (PZT), $SrTiO_3$ (STO), $BaTiO_3$ (BTO), or $Ba[Sr_xTi_{1-x}]O_3$ (BST).

The method for fabricating a capacitor 1 of MIM type comprises the following successive steps, after steps a) and b) described above have been performed:
c) forming a layer of perovskite type dielectric material 2 on the first electrode 3,
d) performing heat treatment at a temperature of at least 600° C. under oxygen so as to crystallize the dielectric material,
e) forming a second electrode 5 on the crystallized dielectric material layer 2.

The temperature of the heat treatment is advantageously higher than or equal to 700° C.

Preferentially, the temperature of the heat treatment is higher than or equal to 850° C. in order to achieve good crystallization of the layer of perovskite type dielectric material 2.

The method will be described by means of the following example given for illustrative and non-restrictive purposes only.

The substrate provided in step a) is produced by performing the following steps:
providing a bulk silicon substrate,
oxidising the bulk substrate so as to form an oxide layer of about 100 nm at the surface thereof,
sputtering a thin layer of titanium dioxide on the silicon oxide, by spraying, the thin layer having a thickness of a few nanometres, for example 5 nm.

According to another alternative, the titanium dioxide can be obtained by oxidation of a layer of titanium deposited on the silicon oxide. In unexpected manner, the inventors observed that deposition of a titanium layer which is subsequently oxidised gives better results than deposition of a layer of titanium dioxide. This in particular enables a better adherence of noble metals such as gold on a silicon oxide layer.

For example, good results were obtained with deposition of a titanium layer having a thickness of 10 nm followed by an oxidation step at a temperature of 750° C. under an atmosphere comprising or constituted by oxygen. The operating conditions are advantageously defined for performing complete oxidation of the titanium layer into titanium dioxide, the duration of the oxidation step being for example equal to 5 minutes. The thickness of the titanium layer can be comprised between 5 nm and 50 nm or between 5 nm and 20 nm.

As a variant, deposition of the titanium layer can be performed at a temperature of more than 200° C., for example between 200° C. and 400° C. It is also possible to provide for oxidation of the titanium layer to be able to be performed at a temperature of more than 500° C. The duration of the annealing step is adjusted to achieve complete oxidation of the titanium layer.

The bottom electrode formed in step b) is achieved by successive depositions of gold, ruthenium oxide, and platinum by sputtering.

The electrode is then etched so as to have the required pattern.

The PZT dielectric material is deposited by sol-gel means (step c)), by spin-coating. The deposition is then dried for a few minutes at about a hundred degrees. A PZT layer of about 200 nm is obtained.

The crystallization annealing (step d)) is performed at 700° C. under $O_2$ for 60 seconds.

During step e), a platinum top electrode is deposited by sputtering. The top electrode presents a thickness of about 100 nm.

The electrodes present a low line resistance. The line resistance is lower by a factor 50 compared with conventional platinum electrodes.

Capacitors containing such electrodes are particularly advantageous for high-frequency applications.

The invention claimed is:

1. Electrode for a structure of Metal-Insulator-Metal type formed on a substrate by a stack successively comprising, from the substrate, an adhesion layer comprising a layer made from $TiO_2$, a gold layer in direct contact with the adhesion layer, a barrier layer made from electrically conducting oxide in direct contact with the gold layer, and a platinum layer in direct contact with the barrier layer.

2. Electrode according to claim 1, wherein the barrier layer is made from $RuO_2$.

3. Electrode according to claim 2, wherein the barrier layer has a thickness greater than or equal to 15 nm.

4. Electrode according to claim 3, wherein the barrier layer has a thickness greater than or equal to 80 nm.

5. Electrode according to claim 1, wherein the adhesion layer is a $TiO_2$/metal bilayer, the metal being chosen from titanium, chromium, or tantalum, and the gold layer is in direct contact with the layer made from $TiO_2$.

6. Electrode according to claim 1, wherein the platinum layer has a thickness of about 100 nm and the gold layer has a thickness ranging from 1 μm to 2 μm.

7. Method for fabricating the electrode according to claim 1, comprising successively:
providing a substrate covered by an adhesion layer made from titanium dioxide,
forming an electrode on the adhesion layer, the electrode being formed by successive depositions of a gold layer, a barrier layer made from electrically conducting oxide and a platinum layer, the electrically conducting oxide being a noble metal oxide.

8. Method for fabricating a capacitor comprising successively:
fabricating an electrode according to claim 1 as a first electrode,
forming a layer of perovskite type dielectric material on the platinum layer of the first electrode,
performing heat treatment at a temperature greater than or equal to 700° C. under oxygen so as to crystallize the dielectric material,
forming a second electrode on the crystallized dielectric material layer.

9. Method according to claim 8, wherein the heat treatment temperature is greater than or equal to 850° C.

10. Electrode according to claim 5, wherein the adhesion layer is a $TiO_2$/titanium bilayer.

11. Electrode according to claim 1, wherein the gold layer has a thickness ranging from 1 μm to 2 μm.

12. Method according to claim 7, wherein the layer made of $TiO_2$ is formed by oxidation of the layer made of Ti metal.

13. Electrode according to claim 1, wherein the adhesion layer completely separates the gold layer and the substrate.

14. Electrode according to claim 1, wherein the layer made of $TiO_2$ completely separates the Ti metal layer and the gold layer.

15. Capacitor of Metal-Insulator-Metal type comprising:
a first electrode formed by a stack successively comprising a gold layer in direct contact with the adhesion layer, a barrier layer made from electrically conducting oxide in direct contact with the gold layer, and a platinum layer in direct contact with the barrier layer, the electrically conducting oxide being a noble metal oxide,
a second electrode,
a layer of perovskite type dielectric material arranged between the first electrode and the second electrode.

16. Capacitor according to claim 15, wherein the barrier layer is made from $RuO_2$ with a thickness greater than or equal to 15 nm.

17. Capacitor according to claim 15, comprising a substrate and wherein the gold layer is separated from the substrate by an adhesive layer made from titanium dioxide.

18. Capacitor according to claim 15, wherein the perovskite type dielectric material is selected from a group consisting of $Pb[Zr_xTi_{1-x}]O_3$, $SrTiO_3$, $BaTiO_3$, and $Ba[Sr_xTi_{1-x}]O_3$.

19. Electrode for a structure of Metal-Insulator-Metal type formed on a substrate by a stack successively comprising, from the substrate, a gold layer, a barrier layer made from $RuO_2$ in direct contact with the gold layer and a platinum layer in direct contact with the barrier layer and wherein the barrier layer has a thickness greater than or equal to 15 nm so as to block diffusion of gold and platinum.

* * * * *